(12) United States Patent
Chen et al.

(10) Patent No.: US 9,312,101 B2
(45) Date of Patent: Apr. 12, 2016

(54) ENDPOINT DETECTION FOR PHOTOLITHOGRAPHY MASK REPAIR

(71) Applicant: Taiwan Semiconductor Manufacturing Company, Ltd., Hsin-Chu (TW)

(72) Inventors: Chien-Lin Chen, Tainan (TW); Chih-Wei Wen, Tainan (TW); Chung-Hung Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/677,554

(22) Filed: Apr. 2, 2015

(65) Prior Publication Data

US 2015/0214006 A1 Jul. 30, 2015

Related U.S. Application Data

(62) Division of application No. 13/789,876, filed on Mar. 8, 2013, now Pat. No. 9,040,212.

(51) Int. Cl.
*H01J 37/304* (2006.01)
*H01J 37/317* (2006.01)
*G03F 1/74* (2012.01)
*H01J 37/305* (2006.01)

(52) U.S. Cl.
CPC ............... *H01J 37/304* (2013.01); *G03F 1/74* (2013.01); *H01J 37/3056* (2013.01); *H01J 37/3174* (2013.01); *H01J 2237/063* (2013.01); *H01J 2237/30466* (2013.01); *H01J 2237/31725* (2013.01); *H01J 2237/31744* (2013.01); *Y10S 430/143* (2013.01)

(58) Field of Classification Search
CPC . H01J 37/304; H01J 37/3056; H01J 37/3174; H01J 2237/063; H01J 2237/30466; H01J 2237/31725; H01J 2237/31744; G03F 1/74; Y10S 430/143
USPC .............. 430/5, 30, 296, 942; 250/492.3
See application file for complete search history.

(56) References Cited

U.S. PATENT DOCUMENTS 7,927,770 B2    4/2011  Kanamitsu

*Primary Examiner* — Christopher Young
(74) *Attorney, Agent, or Firm* — Slater & Matsil, L.L.P.

(57) ABSTRACT

A method includes scanning a lithography mask with a repair process, and measuring back-scattered electron signals of back-scattered electrons generated from the scanning. An endpoint is determined from the back-scattered electron signals. A stop point is calculated from the endpoint. The step of scanning is stopped when the calculated stop point is reached.

20 Claims, 4 Drawing Sheets

ENDPOINT DETECTION FOR PHOTOLITHOGRAPHY MASK REPAIR

PRIORITY CLAIM AND CROSS-REFERENCE

This application is a divisional of U.S. patent application Ser. No. 13/789,876, entitled "Endpoint Detection for Photolithography Mask Repair," filed on Mar. 8, 2013, which application is incorporated herein by reference.

BACKGROUND

Lithography (also known as photolithography) is a commonly used technique in the integrated circuit manufacturing process. In a lithography process, a material layer that is to be patterned is formed first. A photo resist is applied on the material layer. The photo resist is exposed to light through a lithography mask, which includes opaque patterns that allow the light to pass through, and transparent patterns that block the light. The exposed photo resist is developed to form a patterned photo resist. In the patterned photo resist, depending on whether the photo resist is negative or positive, either the portions that were exposed to the light are removed, or the portions that were not exposed to the light are removed. The material layer is then etched, wherein the portions of the material layer protected by remaining portions of the photo resist remain, and the un-protected portions of the material layer are removed.

In order to performing the lithography processes, the lithography mask needs to be made first. The formation of a lithography mask includes forming an opaque layer over a transparent substrate, and then patterning the opaque layer. The regions where the opaque layer has portions left are the opaque portions of the resulting lithography mask, and the regions where the opaque layer is removed are the transparent portions of the resulting lithography mask. In the patterning of the lithography mask, however, defects may occur. For example, some portions of the opaque layer intended to be removed may actually be left un-removed. These portions need to be removed in a repair process.

In the repair process, an electron beam or an ion beam is used to scan and remove the defective portions. The stop point of the repair process, which should be the time point that the undesirable portions of the opaque layer are removed and the underlying transparent substrate is removed, needs to be determined. In conventional stop point detection methods, the end point detection was made by detecting the secondary-electrons, and using secondary-electron signals to visually determine whether the end point is reached or not. The determination of the stop point may also include finding a sharp drop of the secondary-electron signals, finding a low secondary-electron signal that occurs after the sharp drop, and then calculating the stop point by multiplying the low point with a constant. Since the low point is rather ambiguous and suffers from human errors and the fluctuation in the secondary-electron signals, the determination of the stop point is not accurate.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method of determining endpoints and stop points in the repairing of photolithography masks (also referred to as a lithography masks hereinafter) and the apparatus for performing the same are provided in accordance with various exemplary embodiments. The intermediate stages of the repairing process are illustrated. The variations of the embodiments are discussed. Throughout the various views and illustrative embodiments, like reference numbers are used to designate like elements.

Figure 1:
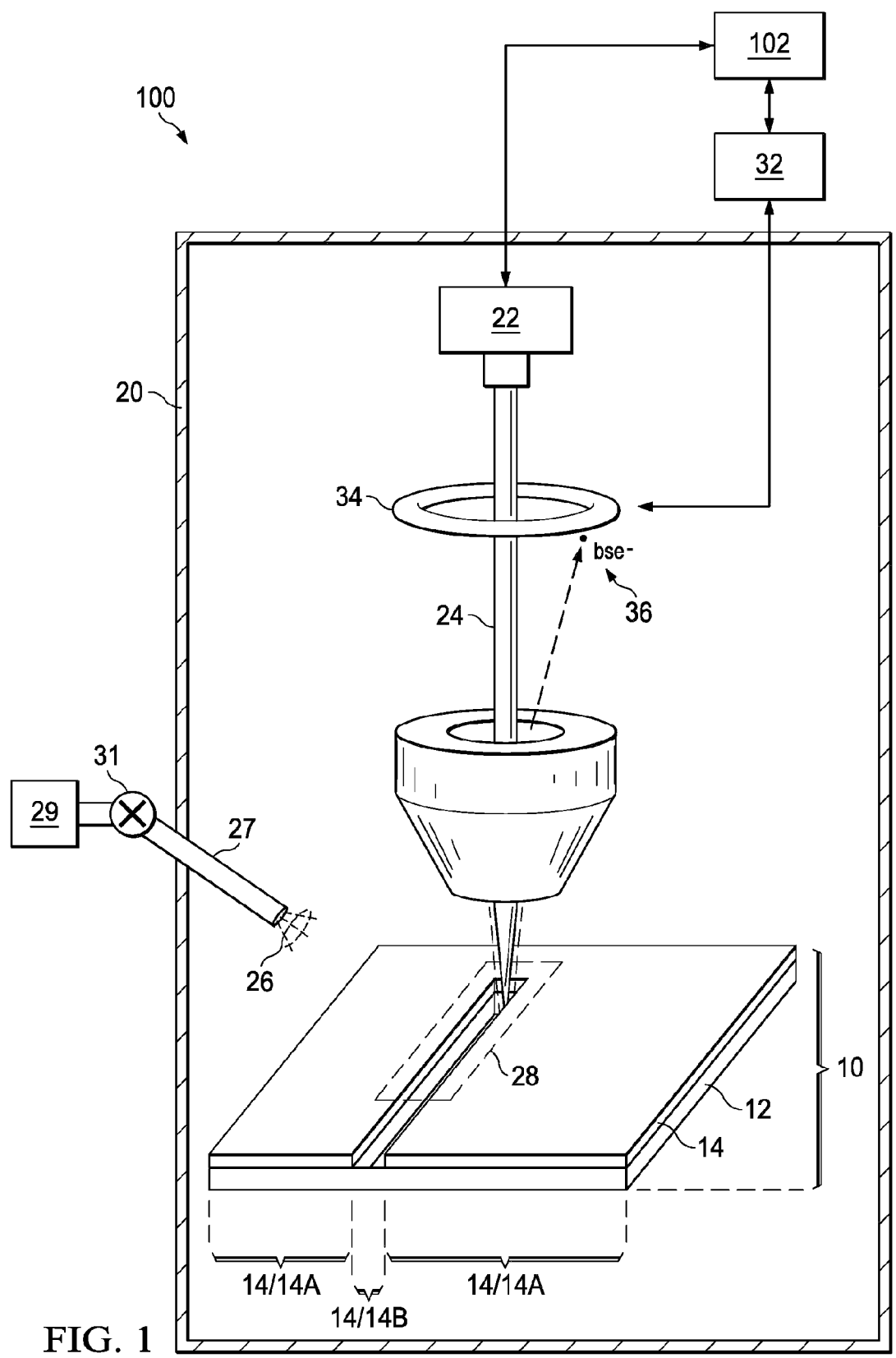
FIG. 1 illustrates an apparatus for determining endpoints and calculating stop points in accordance with some exemplary embodiments.

FIG. 1 illustrates apparatus 100, which is configured to repair lithography mask 10 in accordance with exemplary embodiments. Lithography mask 10 may be a Binary Intensity Mask (BIM). In some embodiments, lithography mask 10 includes transparent substrate 12, and opaque patterns 14 (including 14A and 14B) over transparent substrate 12. Transparent substrate 12 may be a glass substrate, a quartz substrate, or the like, which allows the light that is used in lithography processes to penetrate through. Opaque patterns 14 are formed of an opaque material that blocks the light used in the lithography processes. In some embodiments, opaque patterns 14 comprise Molybdenum Silicide (MoSi) or other applicable materials. Opaque patterns 14 have already been patterned, and the initial manufacturing of opaque patterns 14 has been finished. Defects, however, have been found in opaque patterns 14, and some portions of opaque patterns 14 that are intended to be removed still remain. For example, in the illustrated lithography mask 10, opaque patterns 14 include portions 14A that are intended to be left, and defective portion 14B that is intended to be removed but was undesirably left un-removed. Apparatus 100 is configured to remove portion 14B in order to repair lithography mask 10.

As shown in FIG. 1, apparatus 100 includes chamber 20, which is configured to be vacuumed. E-beam scanner 22 is provided, and is configured to generate electron beam (e-beam) 24 for scanning the defective portion 14B, so that defective portion 14B may be removed. In the scanning process, the portions of lithography mask 10 that are not defects, such as portions 14A, are not scanned by e-beam 24.

During the repairing of lithography mask 10, process gas 26 is introduced into chamber 20 through inlet 27. In some embodiments, process gas 26 includes Xeon di-fluoride ($XeF_2$), which reacts with opaque patterns 14 (MoSi in these examples). Hence, gas reservoir 29, which is connected to inlet 27 through pump and/or valve 31, may have $XeF_2$ stored therein. The reaction is induced and/or accelerated by e-beam 24. The following reaction may occur:

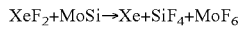

wherein Xe, $SiF_4$, and $MoF_6$ may then be removed from process chamber 20 in a gaseous form.

By controlling which portions of lithography mask 10 are scanned by e-beam 24, the un-needed portions 14B may be removed, and portions 14A may remain.

During the e-beam scan, each pass of e-beam 24 causes one layer of portion 14B to be removed. To completely remove portion 14B, a plurality of travels of e-beam 24, sometimes as many as several hundred travels may be needed to fully remove portion 14B. In some embodiments, the e-beam scan may be made region-by-region, wherein the plurality of travels of e-beam 24 is performed on the same region (for example, region 28 in FIG. 1) of lithography mask 10, until all defects in region 28 are repaired. E-beam 24 then moves to another region of lithography mask 10 to repair the respective region. Region 28 in FIG. 1 is merely illustrative, and in a real lithography mask, region 28 may be much larger, and may include much more opaque patterns 14. For example, region 28 may have the size of 3 μm×3 μm to about 15 μm×15 μm, for example, although region 28 may be greater or smaller. Throughout the description, a process in which all of the defective portions in a region are scanned by e-beam 24 once is referred to as one loop of the e-beam scanning. Accordingly, the repair of one region of lithography mask 10 includes a plurality of loops.

During the e-beam scan, Back-Scattered Electrons (BSEs, shown as bse⁻ in FIG. 1) 36 are generated, and scattered from the scanned portions of lithography mask 10. The BSEs are detected by a BSE signal detector. The BSE signal detector may be, for example, Energy and angle Selective BSE (ESB) detector 32, which includes sensor 34 for receiving the back-scattered electrons 36. Secondary electrons (SE, not shown) may be filtered, and not detected by the BSE signal detector. The BSE signal received by ESB detector 32 may be averaged for the scanned region (such as region 28) to generate a global ESB signal (which is also a global BSE signal). For example, assuming that region 28 is considered as including a plurality of pixels, and a BSE signal is detected by ESB detector 32 for each of the pixels, then the global ESB signal is the average of the BSE signals for all of the pixels in region 28. Accordingly, for each loop in the scanning of region 28, there is one global ESB signal.

Figure 2:
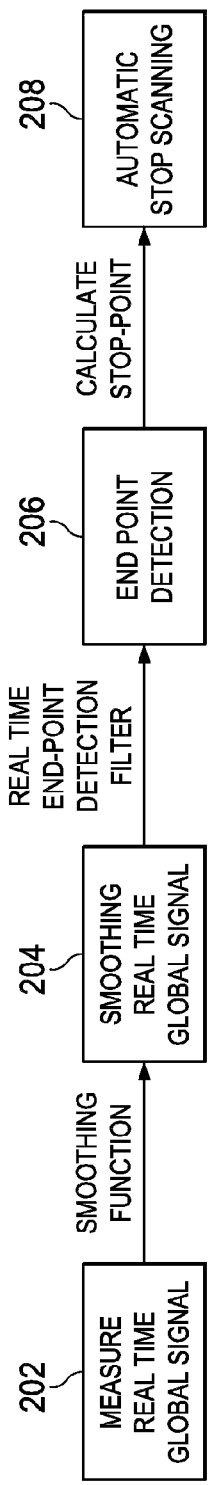
FIG. 2 illustrates an exemplary process flow for determining the endpoint and calculating the stop point in accordance with some embodiments.

FIG. 2 illustrates a process flow for detecting the endpoint and determining stop point in the repairing of photolithography mask 10 in accordance with some exemplary embodiments. Referring to step 202, the global ESB signal is detected. The detection is a real-time detection, wherein in each loop, the respective global ESB signal is generated in real time, and is used in subsequent steps.

Figure 3:
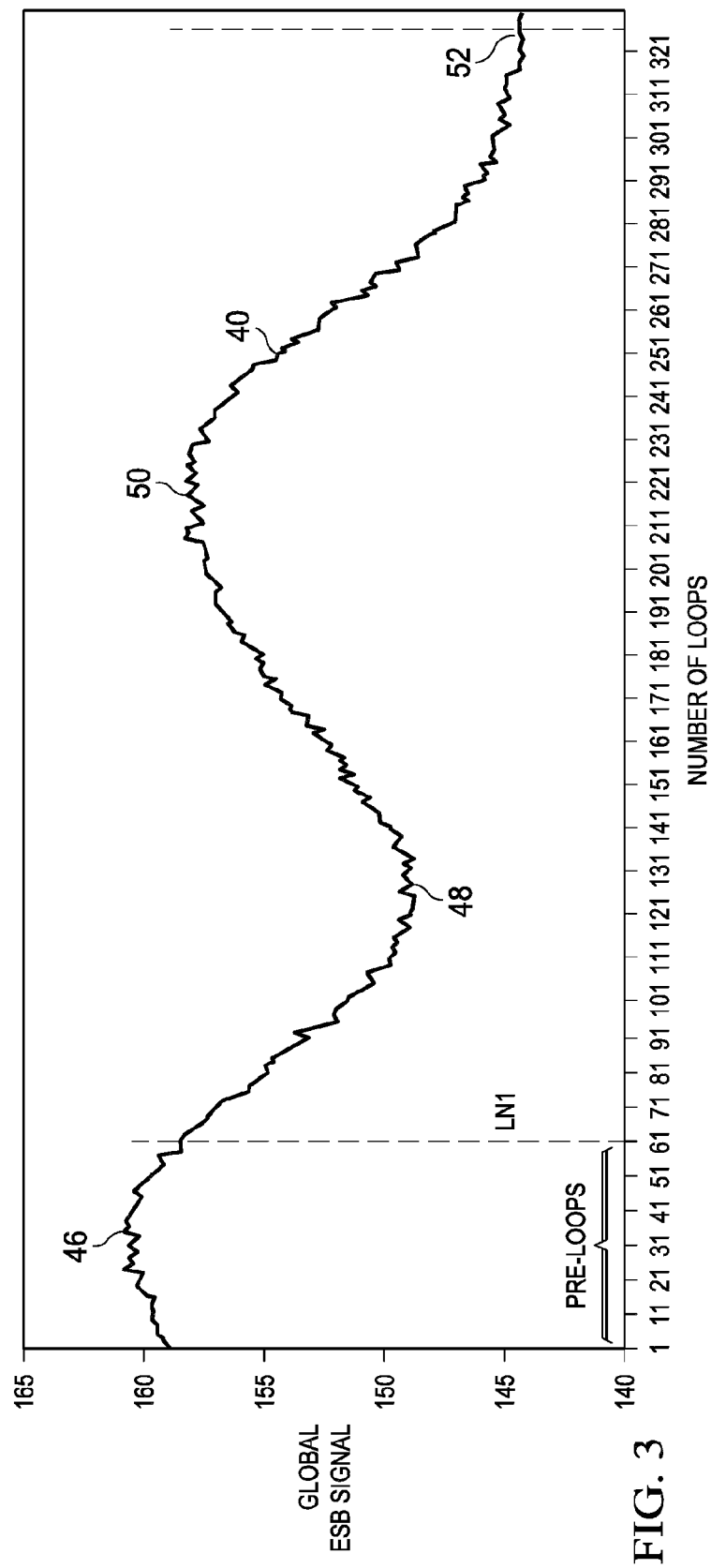
FIG. 3 illustrates exemplary global back-scattered electron signals measured from a repair process in accordance with some exemplary embodiments.

FIG. 3 illustrates an exemplary ESB signal graph, in which the global ESB signals are illustrated as a function of the number of loops (of the e-beam scanning). The X-axis indicates the number of loops that has already been performed, and also indicates the sequence number of the loop that is just preformed. In some embodiments, the Y axis shows normalized global ESB signal strength. In alternative embodiments, the Y axis may show the global ESB signal strength as currents (micro-amps, for example), or any other values that may reflect the global ESB signals. Each of the loops corresponds to a global ESB signal strength, and the global ESB signal strength and the sequence number of the loop is plotted as one dot. Line 40 is the connection line of the plurality of dots corresponding to a plurality of loops.

It is observed that with the proceeding of the e-beam scan, and with the increase in the number of loops that has been performed in the same region 28 of photolithography mask 10, the global ESB signal may increase and decrease. For a specific type of lithography mask (which has its specific material) and a specific repair process, however, the trends of the global ESB signals are similar. For example, FIG. 3 illustrates an exemplary global ESB signal graph for one type of photolithography masks, wherein the global ESB signals first increase to reach first peak 46, drop to valley 48, increase again to second peak 50, and then drops to stop point 52, at which time the underlying transparent substrate 12 (FIG. 1) is exposed. No additional peaks and valleys will be generated after peak 50. After peak 50, the global ESB signals continuously drop until they eventually becomes flat, which indicates that defective portion 14B (FIG. 1) is fully removed, and the e-beam scanning has been performed on the underlying substrate 12 (FIG. 1). At which time, stop point 52 in FIG. 3 is reached, and the e-beam scan may be stopped. It is noted that even if the same type of lithography masks is repaired, there may be process variations, and the global ESB signal strengths of the peaks and the valleys may change, and the sequence of the loops corresponding to the peaks and valley may change slightly. The trends for the same type of lithography masks, however, may be the same.

Figure 5:
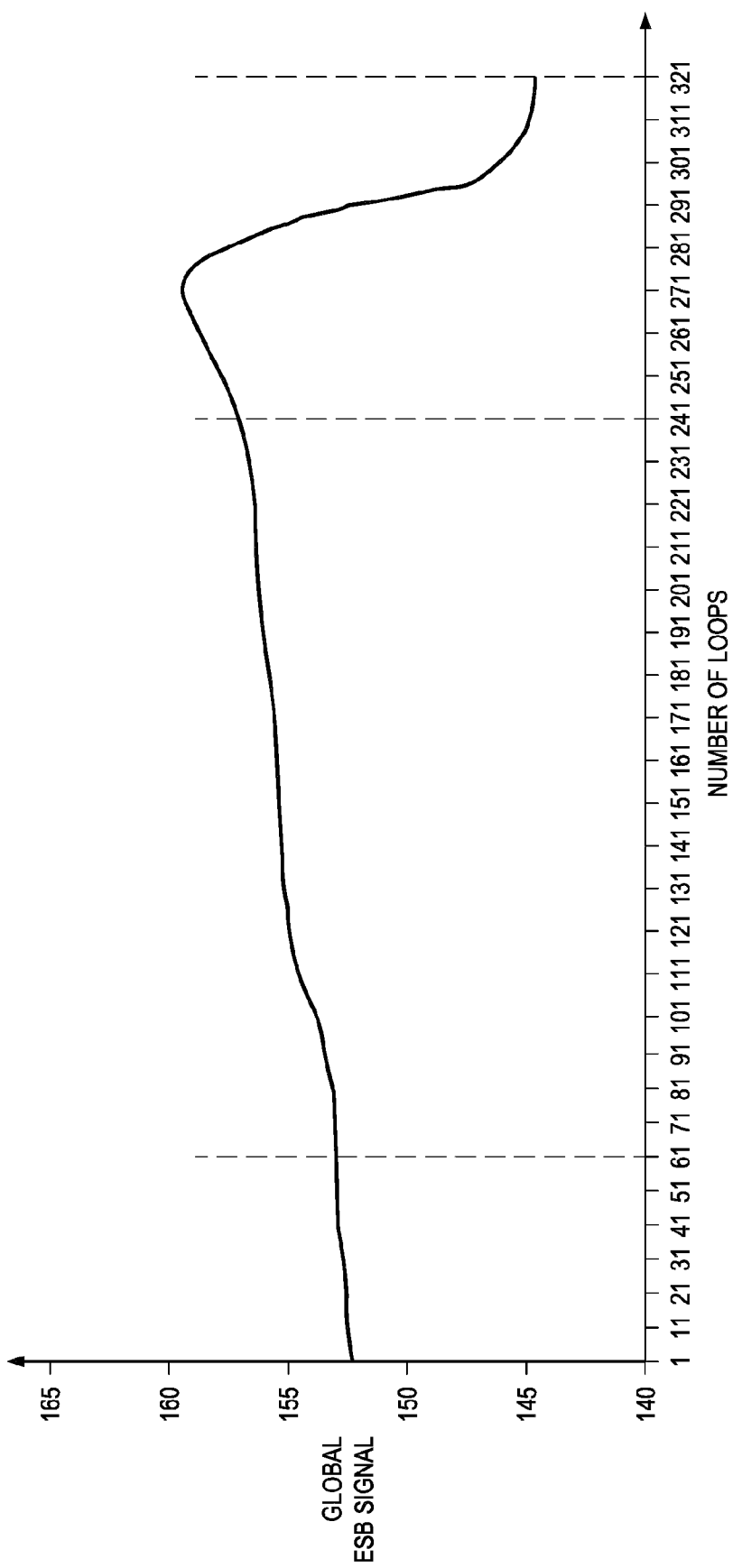
FIG. 5 illustrates exemplary global back-scattered electron signals measured from a repair process in accordance with alternative embodiments.

FIG. 5 illustrates the global ESG signal graph generated in the repair of another type of lithography masks, wherein a single peak 54 is generated, and no additional peaks and valleys are generated in the entire repair process. Accordingly, by performing experimental repair processes on the samples of the same type of photolithography mask, the trend of the respective global ESB signal graph may be found, and the number of peaks and valleys may be found.

Referring back to FIG. 3, a plurality of pre-loops may be performed before the endpoint detection process is initiated. For example, for the lithography masks that have the trench as in FIG. 3, the number of pre-loops is selected so that when the pre-loops are ended, peak 46 has already been passed. In some embodiments, the number of pre-loops may be selected so that the endpoint of the pre-loops is between peaks 46 and 50. Furthermore, the number of pre-loops may be selected so that the endpoint of the pre-loops is between valley 48 and peak 50. In the beginning part of the lithography mask repair process, the variation in the measured global ESG signals may be greater than in the subsequent parts, and hence the pre-loops may be used to avoid the big variations. In some embodiments, the number of pre-loops may be selected to be in the range between about 50 loops and about 150 loops, depending on the type of lithography masks. The optimum number of pre-loops may be found by performing experiments on sample lithography masks, generating the respective global ESB signal graphs, and determining the optimum number of pre-loops from the global ESB signal graphs.

Figure 4:
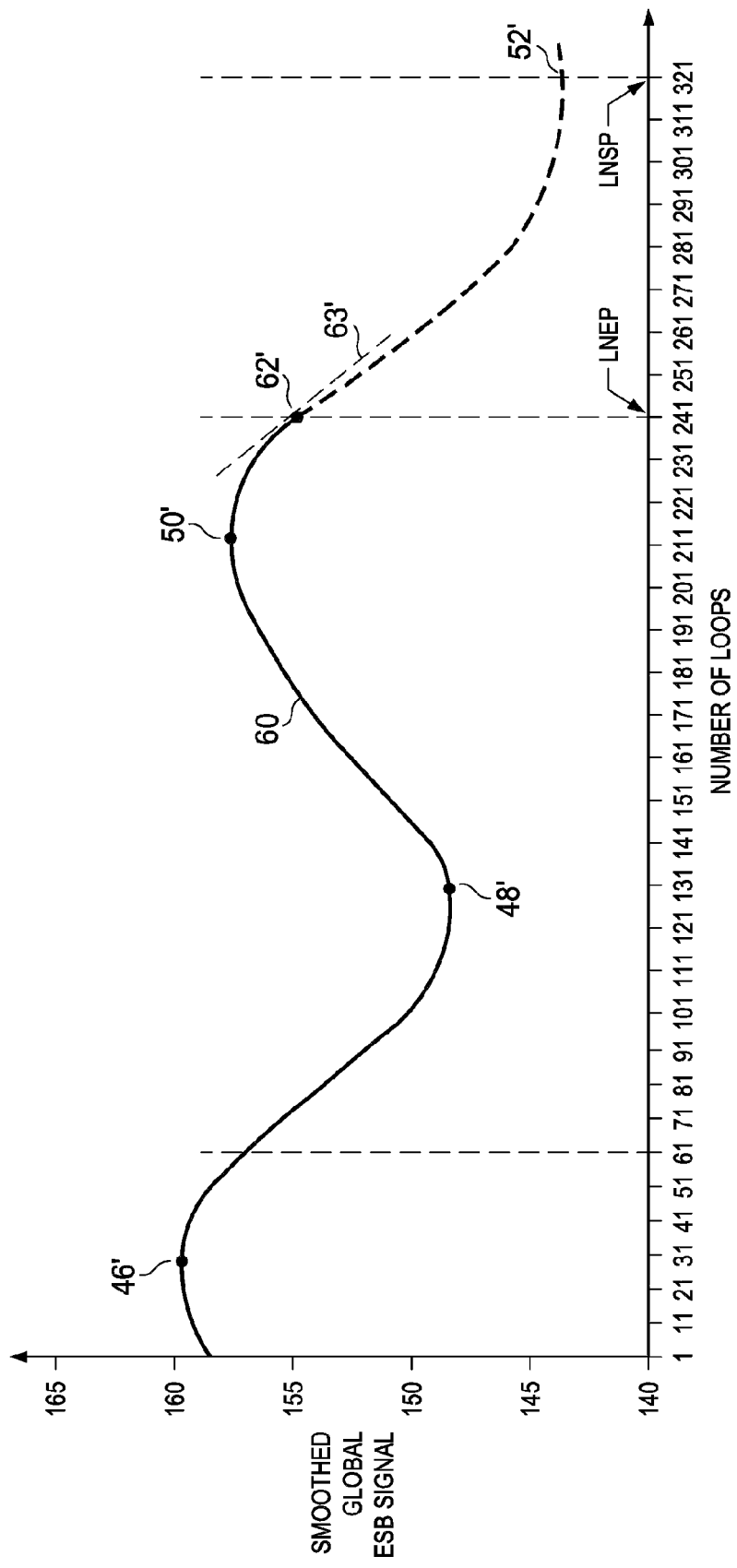
FIG. 4 illustrates smoothed global back-scattered electron signals generated from the global back-scattered electron signals in FIG. 3.

Starting from the point the pre-loops are finished, which corresponds to loop sequence number LN1, the endpoint detection is started. Referring to FIG. 2, in the endpoint detection step (step 204), the global ESB signals are smoothed. The smoothing may also be started from the beginning of the pre-loops in alternative embodiments. The resulting smoothed global ESB signals are illustrated in FIG. 4. In some embodiments, the smoothing may be performed by averaging the global ESB signals in a selected number (referred to as average count hereinafter) of loops. For example, three, four, five, six, or more of the global ESB signals in FIG. 3 may be averaged to generate a point in FIG. 4, wherein the averaged values form line 60 in FIG. 4. The average count is selected so that the small glitches (up and downs) as shown in FIG. 3 is substantially, and may be fully, removed, while the general trend remains. For example, the average count may be 3. Accordingly, the smoothed global ESB signals corresponding to loop sequence 151 in FIG. 4 may be the average of global ESB signals in loop sequences 149, 150, and 151 in FIG. 3. The generation of the smoothed line 60 is performed in real time. In FIG. 4, there are still peaks 46' and 50' corresponding to peaks 46 and 50, respectively, in FIG. 3, and valley 48' corresponding to valley 48 in FIG. 3. The optimum average count may be selected to be the minimum number of loops that, when averaged, can cause the glitches to disappear. For example, if the glitches in the smoothed line 60 disappear when three or more points in FIG. 3 are averaged to generate one point in FIG. 4, then the average count may be selected as 3, although a greater number may be selected.

Next, with the proceeding of the e-beam scanning, the capturing of the global ESB signals, and the smoothing of the global ESB signals, the slopes of the smoothed global ESB signal as shown in FIG. 4 is analyzed in real time, which analysis is referred to as the filtering of the smoothed global signal 60. Line 63' is used as an example of the slope of point 62'. Through the analysis of the slopes, valley 48' and peak 50' may be found. For example, in FIG. 4, valley 48' is the turning point where the slopes change from negative to positive, and peak 50' is the turning point where the slopes change from positive to negative.

The slope at loop sequence number LNA (not shown in FIG. 4, can be any of the loop sequence number) may be calculated in real time using equation:

$$SLNA = (SEBS_{LNA} - SEBS_{LNB})/(LNA - LNB)$$ [Eq. 1]

Wherein $SEBS_{LNA}$ is the smoothed global ESB signal at loop sequence number LNA, and $SEBS_{LNB}$ is the smoothed global ESB signal at loop sequence number LNB, which sequence number is smaller than loop sequence number LNA. For example, if LNA is 200, LNB will be (LNA−C), with count C being an integer. Count C is a pre-selected value used throughout the process of the endpoint detection. Count C affects the accuracy and the stability of the calculated slopes, wherein a smaller C value results in an increased accuracy in the calculated slope. However, the calculated slopes may have greater fluctuation. Conversely, a greater C value results in a reduced accuracy in the calculated slope. The resulting calculated slopes, however, may have smaller fluctuations. The optimum C value may thus be a balanced value taking both the accuracy and the stability into consideration. In some exemplary embodiments, count C may be between about 3 and 10.

Referring to FIG. 4, after peak 50' is reached, which may be found through the analysis of slopes, the smoothed global ESB signal 60 continuous to drop until endpoint 62' is reached. The endpoint 62' is defined as a point at which the slope is smaller than a pre-determined threshold slope ST for a consecutive number of loops. Therefore, when the real-time calculated slopes are smaller than the threshold slope ST for the consecutive number of loops, endpoint 62' is found (step 206 in FIG. 2). Since the slopes around endpoint 62' are negative, it also means that the absolute values of the slopes around endpoint 62' are greater than the absolute value of the pre-determined threshold slope ST for a consecutive number of loops. The consecutive number of loops is also pre-determined, and may be, for example, 3, 4, 5, 6, or any integer greater than 6. The pre-determined threshold slope ST and the consecutive number of loops may be determined by performing experiments on sample lithography masks.

Assuming the loop sequence at endpoint 62' is LNEP, then the loop sequence number LNSP of stop point 52', at which the e-beam scan is stopped, is calculated in real time using equation:

$$LNSP = LNEP*CR + PLN$$ [Eq. 2]

Wherein CR is a pre-determined constant ratio, and PLN is a pre-determined number of post-loops. In some embodiments, CR is a value greater than 1, and is determined so that when the total number of loops in the repair process is equal to LNEP*CR, the defective portion 14B (FIG. 1) is fully removed, and substantially no over-etching has happened yet. The number of post-loops PLN may be selected for over-etching, and may be a number equal to zero or any positive integer number. The optimum values of CR and PLN may be determined by performing experimental repair processes on sample lithography masks, and inspecting the sample lithography masks, so that the defective portion 14B (FIG. 1) is removed fully, while the over-etching is not substantial.

In some embodiments, after endpoint 62' is reached, the measurement of the global ESB signal, the smoothing of the global ESB signal, and the calculation of the slopes may be stopped, although these actions may continue to be performed. For example, after the endpoint 62' is reached, control system 102 (FIG. 1) may stop monitoring the global ESB signal, and may wait for the loops to be executed for additional (LNEP*(CR−1)+PLN times, and stop the e-beam scan at stop point 52' (step 208 in FIG. 2). During the entire scanning process between endpoint 62' and stop point 52', the global ESB signals do not need to be, although they can be, monitored.

The above-discussed endpoint and stop point detection may also be used on FIG. 5. Since FIG. 5 is simpler due to the existence of a single peak, the determination is easier.

Referring back to FIG. 1, lithography mask repair system 100 includes control unit 102, which may receive the global ESB signals from ESB detector 32 and the loop sequence number from e-beam generator 22, smoothing the global ESB signals, calculating the slopes of the smoothed global ESB signals, and calculating the stop point 52' (FIG. 4). When the stop point 52' in FIG. 4 is reached, control unit 102 controls E-beam generator 22 to stop generating the e-beam. Accordingly, the steps shown in FIG. 2 may be fully automated. In alternative embodiments, the tasks of generation of the global ESB signals may be shifted to the control unit 102, while ESB detector 32 outputs un-averaged ESB signals.

In the embodiments, by calculating the endpoints and stop points of lithography mask repair processes, more accurate lithography mask repairs may be achieved. Experiment results indicated that when conventional endpoint detection using secondary-electrons are used, the success rate of the first-time repair is about 53% to about 55%. Using the methods in according to the embodiments, the success rate of the first-time repair is increased to about 88 percent. Furthermore, the repair accuracy is improved over the conventional method by about 75%.

In accordance with some embodiments, a method includes scanning a lithography mask, and measuring back-scattered electron signals of back-scattered electrons generated from the scanning. An endpoint is determined from the back-scattered electron signals. A stop point is calculated from the endpoint. The step of scanning is stopped when the calculated stop point is reached.

In accordance with other embodiments, a method includes scanning a lithography mask, measuring global back-scattered electron signals of back-scattered electrons from the lithography mask, smoothing the global back-scattered electron signals to generate smoothed global back-scattered electron signals, calculating slopes of the smoothed global back-scattered electron signals in real time, and comparing the slopes with a pre-selected threshold slope to determine an endpoint. At the endpoint, a first number of loops of scanning have been executed. The method further includes calculating a second number of loops of scanning, wherein the step of calculating the second number includes multiplying the first number by a constant ratio greater than one to generate a product. The step of scanning is stopped when the second number of loops of scanning is reached.

In accordance with yet other embodiments, an apparatus includes an e-beam generator configured to generate an e-beam, an ESB detector configured to detect back-scattered electrons resulted from the e-beam, and a control unit coupled to the e-beam generator and the ESB detector. The control unit is configured to receive signals from the ESB detector, calculate an endpoint from the signals, calculate a stop point from the endpoint, and stop the e-beam generator from generating the e-beam when the stop point is reached.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus for determining a stop point for repairing a lithography mask, the apparatus comprising:
   a gas reservoir having an outlet pointing at the lithography mask;
   an e-beam generator configured to generate an e-beam to scan the lithography mask;
   a Back-Scattered Electron (ESB) detector configured to detect back-scattered electrons scattered from scanned portions of the lithography mask and to generate signals; and
   a control unit coupled to the e-beam generator and the ESB detector, wherein the control unit is configured to:
      process the signals generated by the ESB detector, and to determine a stop point from the signals; and
      stop the repairing the lithography mask when the stop point is reached, wherein at the stop point, an opaque pattern in the scanned portions of the lithography mask is removed to expose an underlying substrate.

2. The apparatus of claim 1, wherein the control unit is configured to:
   calculate an endpoint from the signals; and
   determine the stop point from the endpoint.

3. The apparatus of claim 2, wherein the control unit is further configured to:
   calculate the stop point from the endpoint; and
   stop the repairing the lithography mask by stopping the e-beam generator from generating the e-beam.

4. The apparatus of claim 1, wherein the signals from the ESB detector are global back-scattered electron signals of a scanned region of the lithography mask, and the control unit is further configured to:
   smooth the global back-scattered electron signals through averaging the signals.

5. The apparatus of claim 4, wherein the control unit is further configured to:
   calculate slopes of smoothed global back-scattered electron signals; and
   compare the slopes with a pre-selected threshold slope to determine an endpoint, wherein at the endpoint, a first number of loops of scanning has been executed.

6. The apparatus of claim 5, wherein the control unit is further configured to:
   calculate a second number of loops of scanning comprising multiplying the first number by a constant ratio greater than one to generate a product, wherein the repairing the lithography mask is stopped at a time after the second number of loops of scanning is finished.

7. The apparatus of claim 5, wherein the control unit is configured to determine the endpoint by determining whether a consecutive number of the slopes calculated from the smoothed global back-scattered electron signal are smaller than the pre-selected threshold slope.

8. The apparatus of claim 1 further comprising a chamber, wherein the e-beam generator is configured to project the e-beam in the chamber.

9. The apparatus of claim 1, wherein the ESB detector comprises an energy and angle selective BSE detector.

10. An apparatus for determining a stop point for repairing a lithography mask, the apparatus comprising:
    an e-beam generator configured to generate an e-beam to scan the lithography mask;
    a Back-Scattered Electron (ESB) detector configured to detect back-scattered electrons scattered from scanned portions of the lithography mask and to generate signals; and
    a control unit coupled to the e-beam generator and the ESB detector, wherein the control unit is configured to:
       determine an endpoint from the signals, wherein at the endpoint, the signals start to have a dropping rate greater than a pre-determined dropping rate;
       calculate a stop point from the endpoint, wherein at the stop point, the signals are substantially flat; and
       stop the e-beam generator from generating the e-beam when the stop point is reached.

11. The apparatus of claim 2, wherein the signals are global back-scattered electron signals averaged from Back-Scattered Electron (BSE) signals generated by the ESB detector.

12. The apparatus of claim 3, wherein the control unit is further configured to:
    smooth the global back-scattered electron signals generated from the ESB detector, wherein the endpoint is determined from the smoothed global back-scattered electron signals.

13. The apparatus of claim 2, wherein the ESB detector comprises an energy and angle selective BSE detector.

14. The apparatus of claim 2 further comprising a chamber, wherein the e-beam generator is configured to project the e-beam in the chamber.

15. An apparatus comprising:
    an e-beam generator configured to generate an e-beam;

a Back-Scattered Electron (ESB) detector configured to detect back-scattered electrons resulted from the e-beam; and a control unit configured to:
  receive signals from the ESB detector;
  calculate an endpoint from the signals;
  calculate a stop point from the endpoint; and
  stop the e-beam generator from generating the e-beam when the stop point is reached.

16. The apparatus of claim 15, wherein the control unit is further configured to:
  smooth global back-scattered electron signals generated by the ESB detector;
  calculate slopes of smoothed global back-scattered electron signals;
  compare the slopes with a pre-selected threshold slope to determine the endpoint, wherein at the endpoint, a first number of loops of scanning has been executed; and
  calculate a second number of loops of scanning comprising multiplying the first number by a constant ratio greater than one to generate a product, wherein the e-beam generator is stopped at a time after the second number of loops of scanning is finished.

17. The apparatus of claim 16, wherein the control unit is further configured to stop calculating and comparing the slopes after the endpoint is determined.

18. The apparatus of claim 16, wherein the control unit is further configured to determine the endpoint when a consecutive number of the slopes are smaller than the pre-selected threshold slope.

19. The apparatus of claim 15 further comprising:
  a chamber, wherein the e-beam generator is configured to project the e-beam in the chamber;
  a gas reservoir connected to an inlet of the chamber; and
  Xeon di-fluoride ($XeF_2$) stored in the gas reservoir.

20. The apparatus of claim 15, wherein the ESB detector comprises an energy and angle selective BSE detector.

* * * * *

UNITED STATES PATENT AND TRADEMARK OFFICE
CERTIFICATE OF CORRECTION

PATENT NO.        : 9,312,101 B2
APPLICATION NO.   : 14/677554
DATED             : April 12, 2016
INVENTOR(S)       : Chien-Lin Chen et al.

Page 1 of 1

It is certified that error appears in the above-identified patent and that said Letters Patent is hereby corrected as shown below:

In the claims,

In Col. 8, line 52, claim 11, delete "The apparatus of claim 2," and insert --The apparatus of claim 10,--.

In Col. 8, line 55, claim 12, delete "The apparatus of claim 3," and insert --The apparatus of claim 11,--.

In Col. 8, line 61, claim 13, delete "The apparatus of claim 2," and insert --The apparatus of claim 10,--.

In Col. 8, line 63, claim 14, delete "The apparatus of claim 2," and insert --The apparatus of claim 10,--.

Signed and Sealed this
Fourteenth Day of June, 2016

Michelle K. Lee
*Director of the United States Patent and Trademark Office*